United States Patent [19]

Mohwinkel

[11] Patent Number: 5,610,563
[45] Date of Patent: Mar. 11, 1997

[54] SLOT LINE TO CPW CIRCUIT STRUCTURE

[75] Inventor: Clifford A. Mohwinkel, San Jose, Calif.

[73] Assignee: Endgate Corporation, Sunnyvale, Calif.

[21] Appl. No.: 555,493

[22] Filed: Nov. 8, 1995

Related U.S. Application Data

[60] Division of Ser. No. 400,025, Mar. 6, 1995, which is a continuation-in-part of Ser. No. 313,927, Sep. 26, 1994, abandoned.

[51] Int. Cl.⁶ .................................. H01P 5/10; H01P 5/12
[52] U.S. Cl. ............................ 333/128; 333/26; 333/247; 257/778
[58] Field of Search ................................ 333/26, 33, 128, 333/246, 238, 247; 257/275, 778

[56] References Cited

U.S. PATENT DOCUMENTS

| | | | |
|---|---|---|---|
| 3,995,239 | 11/1976 | Head et al. | 333/26 X |
| 4,005,375 | 1/1977 | Pringle et al. | 333/26 X |
| 4,097,814 | 6/1978 | Cohn | 330/286 |
| 4,739,519 | 4/1988 | Findley | 333/128 X |
| 5,066,926 | 11/1991 | Ramachandran et al. | 330/311 |
| 5,142,239 | 8/1992 | Brayton et al. | 330/66 |
| 5,149,671 | 9/1992 | Koh et al. | 437/183 |
| 5,426,400 | 6/1995 | Ho et al. | 333/26 |

OTHER PUBLICATIONS

Paul Horowitz, FET Switches, MOSFET logic and power switches, The Art of Electronics Second Edition, p. 159, 1989.

John Young, consultant, Valerie Illingworth, Editor, Emitter-Coupled Logic, The Penguin Dictionary of Electronics, Second Edition, pp. 162–165, 1988.

*Primary Examiner*—Paul Gensler
*Attorney, Agent, or Firm*—Edward B. Anderson

[57] ABSTRACT

A means of connecting a plurality of essentially identical active devices is presented for the purpose of multifunction and multiple function operation. These devices, mounted on a chip, are flip-mounted to a circuit motherboard having large passive elements. A push-pull amplifier is presented as an example in which the multiple function operation is the combining of amplifiers whose active devices are on a single chip. The electromagnetic coupling, impedance matching and signal transmission are variously provided by the use of striplines, slotlines, coplanar waveguides, and a slotline converted into a coplanar waveguide. In particular, a conversion of a split coplanar slotline to dual coplanar waveguides provides signal transmission to a pair of transistors flip-mounted onto the coplanar waveguides.

2 Claims, 5 Drawing Sheets

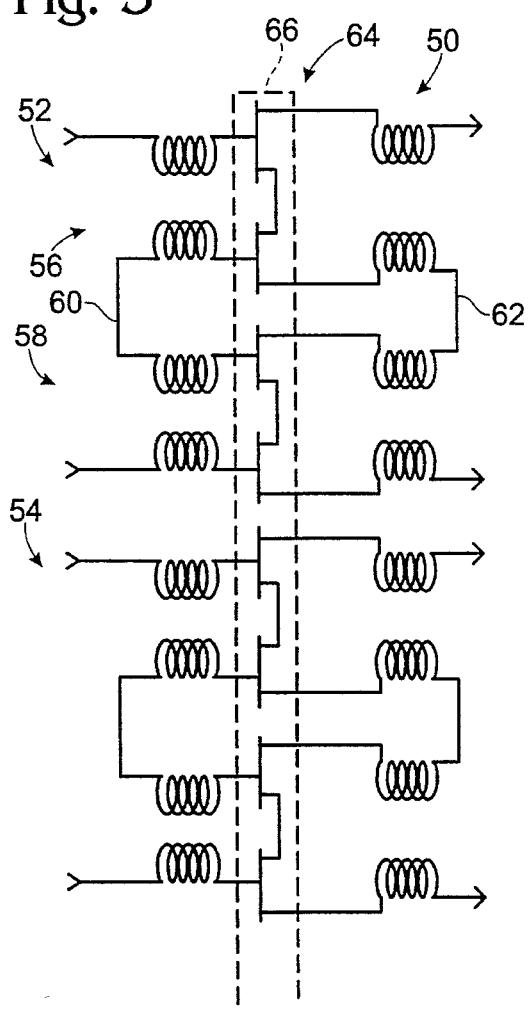
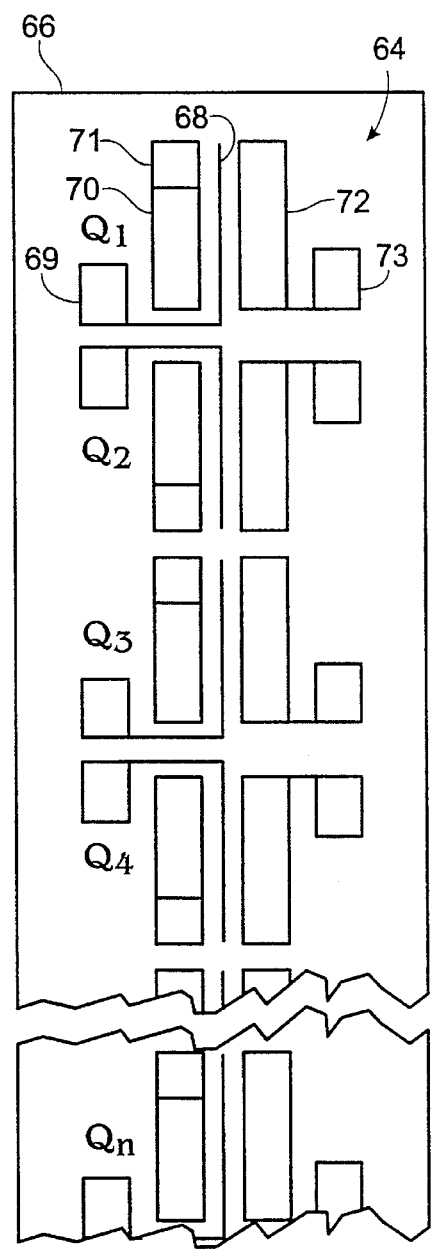

SLOT LINE TO CPW CIRCUIT STRUCTURE

This application is a division of application Ser. No. 08/400,025, filed Mar. 6, 1995, which application is a continuation-in-part of application Ser. No. 08/313,927, filed on Sep. 26, 1994, now abandoned.

BACKGROUND OF THE INVENTION

1. Field of the Invention

This invention relates to circuit structures having an integrated circuit flip mounted on a base substrate having metalization connected to the integrated circuit. More specifically, it relates to such an integrated circuit having a plurality of devices, with interconnection between the devices being provided by metalization on the substrate.

2. Related Art

Because GaAs integrated circuits are comparatively expensive, it is common to make microwave and millimeter (mm) wave circuits as hybrid circuits. The active devices that require the use of GaAs are fabricated on GaAs chips which are then mounted on a motherboard having a less expensive substrate, such as silicon, $Al_2O_3$, BeO, and AlN.

Conventional circuits having a plurality of active devices are made by fabricating a separate integrated circuit or chip for each of the active devices. Circuit metalization and passive devices are printed on the motherboard and each chip is then mounted at an assigned site on the motherboard. The integrated circuit on the chip can be very simple, such as a single FET. It may also be more complex, incorporating a variety of devices to provide an overall function, such as is provided by an amplifier.

A complex circuit may require that numerous such chips be made and mounted. The resultant requirement for individual handling of small chips also tends to make the fabrication process somewhat costly. Alternatively, when a chip has a complex circuit, it is more expensive to make since it requires a larger GaAs substrate than its more simple cousin, and the benefits of hybrid circuit structure are not as fully realized.

There is thus a need for a method of hybrid circuit construction, and thereby a hybrid circuit structure that, when applied to microwave and mm-wave circuits, minimizes the size of GaAs substrates used and is simple to fabricate, thereby providing for efficient fabrication at reduced cost.

SUMMARY OF THE INVENTION

The present invention provides a circuit structure for transmitting electromagnetic signals. In particular it provides an electronic circuit structure comprising a substrate, a slotline mounted on the substrate having first and second planar slotline conductors, and a coplanar waveguide having first, second and third waveguide signal conductors, with the second and third waveguide conductors spaced from and positioned on opposite sides of the first waveguide conductor. The space between the first waveguide conductor and the third waveguide conductor forms a first slot having a first slot width. The first slotline conductor is connected to both the first and third waveguide conductors. An enlarged opening in the first slotline conductor is in communication with the first slot and positioned where the first slotline conductor is connected to both the first and third waveguide conductors.

In one aspect of the invention, the circuit structure further comprises a chip having a transistor with a control terminal and two current-carrying terminals. The chip is mounted relative to the substrate with the control terminal flip-mounted onto the first waveguide conductor and one current-carrying terminal flip-mounted onto the second waveguide conductor. An output conductor is mounted onto the substrate and connected to the other current-carrying terminal for conducting current through the transistor. This circuit structure provides active gain to the signal converted from the slotline, rather than loss as provided by the passive conversion alone.

In another aspect of the invention, a second coplanar waveguide, parallel with the first coplanar waveguide, has a fourth waveguide conductor positioned adjacent to the second waveguide conductor and has a fifth waveguide conductor spaced from the fourth waveguide conductor opposite from the second waveguide conductor. The space between the fourth waveguide conductor and the fifth waveguide conductor forms a second slot and the second slotline conductor is connected to both the fourth waveguide conductor and the fifth waveguide conductor. There is a second enlarged opening in the second slotline conductor in communication with the second slot positioned where the second slotline conductor is connected to both the fourth and fifth waveguide conductors. The signals transmitted on the first and second slotlines are thereby both converted from transmission on dual slotlines to transmission on coplanar waveguides.

It will thus be apparent that the present invention provides a circuit which is simple and economical to construct. These and other features and advantages of the present invention will be apparent from the preferred embodiments described in the following detailed description and illustrated in the accompanying drawings.

BRIEF DESCRIPTION OF THE DRAWINGS

FIG. 3 is a schematic of multiple series-connected circuits of FIG. 2 using a chip having an extended array of FETs.

FIG. 4 is a simplified plan view of a chip usable in the circuits of FIG. 3.

DETAILED DESCRIPTION OF THE PREFERRED EMBODIMENT

Figure 1:
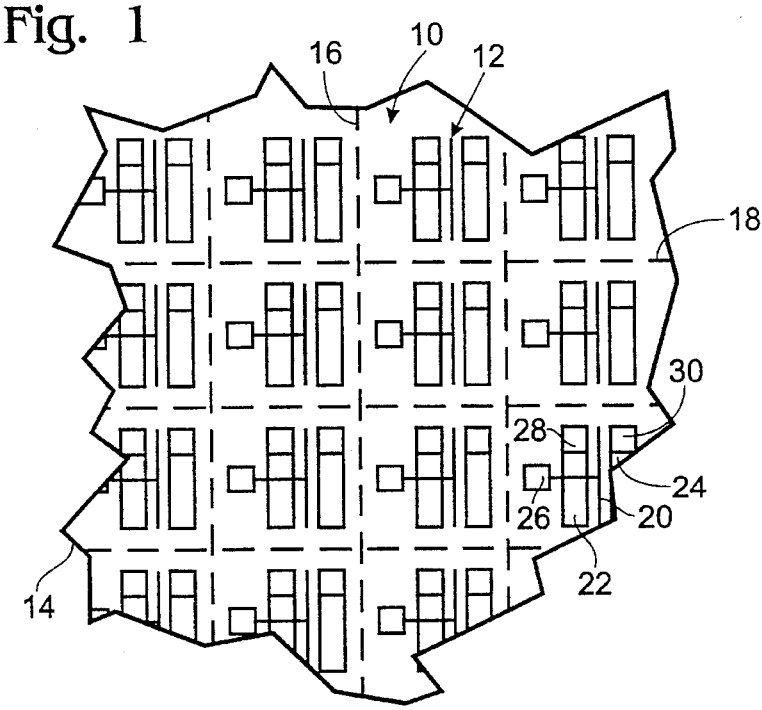
FIG. 1 is a simplified plan view of a portion of a wafer having an array of FETs for use in making a circuit according to the invention.

One aspect of the present invention is directed to the use of a single chip having a plurality of active devices separately connected to a subcircuit formed on a motherboard. Referring initially to FIG. 1, an array 10 of active devices, shown as FETs 12, are formed on a wafer 14 using conventional techniques. The term active device refers to individual elements, such as diodes or transistors, or to any related integrated circuit, such as an amplifier.

Vertical and horizontal dashed lines, such as lines 16 and 18, illustrate potential saw or scribe streets for dividing one or more sets of FETs from adjacent FETs. Each FET includes a gate 20, or control terminal, a source 22 and a drain 24. The source and drain are also referred to as current-carrying terminals. Each gate, source and drain is connected to at least one connection terminal, such as respective terminals 26, 28 and 30.

Figure 9:
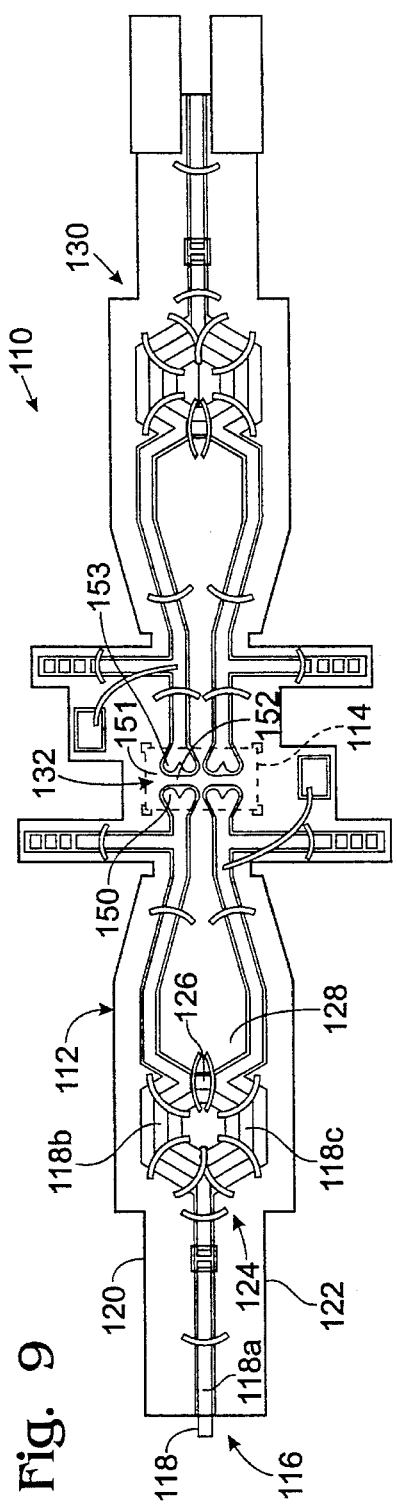
FIG. 9 illustrates a plan view of a third embodiment of the circuit of FIG. 3 using coplanar waveguides.
Figure 10:
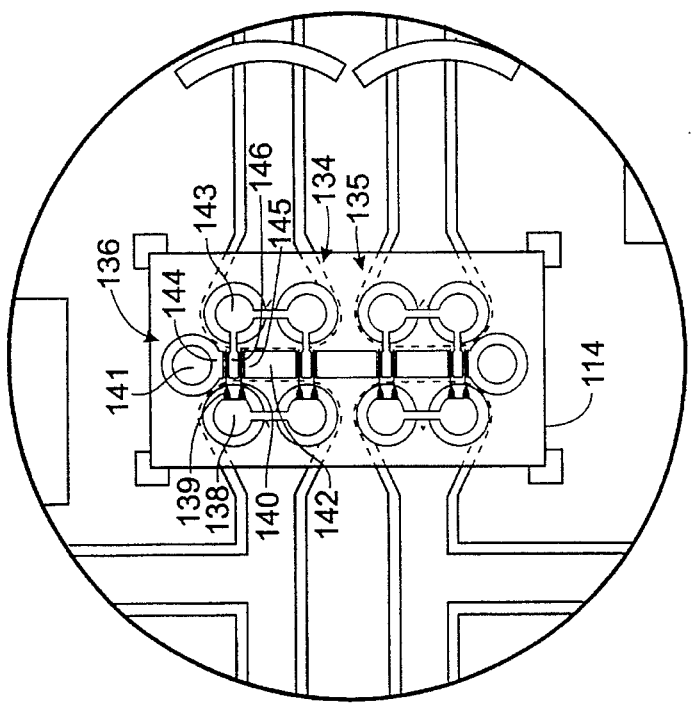
FIG. 10 is an enlarged view illustrating the FET layout for a chip in the circuit of FIG. 9.

Wafers 14 may be produced in large volumes, thereby making each active device relatively inexpensive. Selected wafers may then be divided into arrays of active devices by dividing them using a selected cut pattern so that the resulting chips have active devices with connection terminals corresponding in position to connection terminals on a motherboard. By changing the wafer cut pattern different arrays of active devices can be used to form different circuits. In one application of this concept, the active devices on a chip are not interconnected. In other applications, however, there may be some interconnection, while still having separate connection terminals for each active device. An example of this latter feature is shown in FIGS. 9 and 10, described below, in which adjacent like terminals, such as sources or drains, are connected together.

FIG. 1 illustrates a simple form of the invention in which all of the devices on the wafer are identical. When it is desired to use different devices, a wafer is made with clusters of the different devices in a repeated configuration or pattern.

One application where individual, multiple-device arrays may be used is in the construction of a gate array of large transistors for high current conduction or high power output. For microwave and mm-wave applications, this is often provided by the connection of FETs by Wilkinson combiners or the equivalent to provide impedance transformation as well as to combine multiple terminal connections.

Figure 2:
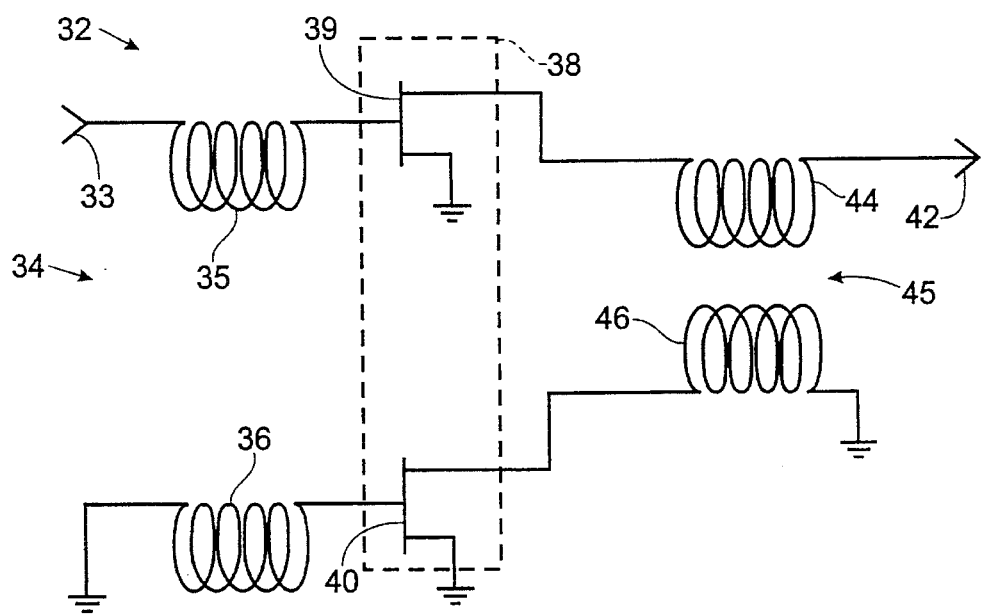
FIG. 2 is a schematic of a push-pull amplifier circuit that can be made according to the invention using a set of FETs from the array of FIG. 1.

Similar results may be achieved using a push-pull amplifier circuit, such as circuit 32 shown in FIG. 2. This circuit, while providing inherent benefits, particularly with respect to impedance transformation, over conventional multi-FET, parallel connected power amplifiers, may be constructed using an active-device array chip as has been described with reference to FIG. 1. Circuit 32 includes an input terminal 33, an input electromagnetic coupling 34 formed by a first input coupling element 35 and a second input coupling element 36 electromagnetically coupled to element 35.

A chip 38, represented by dashed lines, includes first and second FETs 39 and 40. Element 35 couples the input terminal to the gate of the first FET. Element 36 couples the gate of the second FET to a common potential, such as ground.

The drain of FET 39 is coupled to an output terminal 42 by a first output coupling element 44 forming part of an output electromagnetic coupling 45. A second output coupling element 46, electromagnetically coupled with element 44, couples the drain of FET 40 to ground.

Through electromagnetic coupling on the input and output, the signal is divided for amplification by two FETs. This structure may be used in a series/parallel push-pull configuration, as shown in FIG. 3 for impedance transformation. This figure illustrates a power amplifier 50 having a plurality of series (push-pull) sections, such as sections 52 and 54. Each section 52 and 54 includes two circuit portions 56 and 58 that are equivalent to circuit 32 of FIG. 2 except that rather than the connections to ground, the two circuit portions are joined together, as shown at connections 60 and 62. This results in a virtual ground at the point of connection.

By dividing an input signal into a signal for each circuit section and recombining the output signals, such as by the use of Wilkinson dividers, substantial power combination is achieved. Impedance matching can be provided at the individual FETs, or before or after signal division or recombination.

The FETs may be aligned in a linear array 64 of FETs, which array may be formed of a single chip 66 fabricated as has been described with reference to FIG. 1. An exemplary FET or bipolar transistor physical diagram for chip 66 is shown in FIG. 4. In this case, the transistors are shown as replications of transistor pairs $Q_1$ and $Q_2$, $Q_3$ and $Q_4$, and the like. Each transistor pair corresponds with the first and second FETs in a circuit portion shown in FIG. 3. As was described with reference to FIG. 1, each FET, such as FET $Q_1$, includes a gate 68, a gate terminal 69, a source 70, a source terminal 71, a drain 72, and a drain terminal 73. The structures of these transistor pairs can be different, depending on the respective functions they perform.

Figure 5:
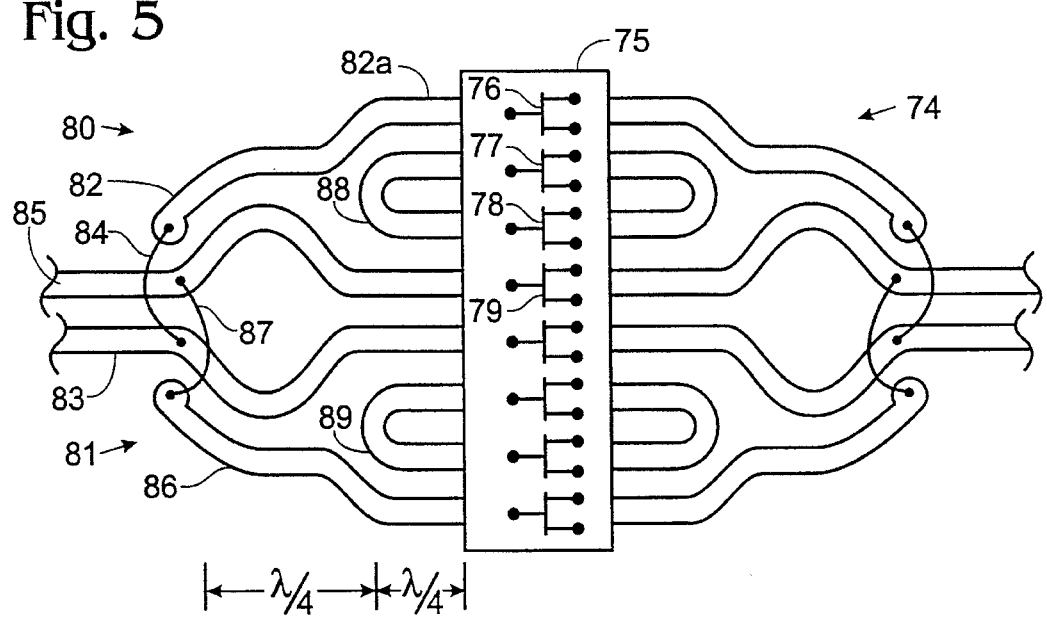
FIG. 5 illustrates a plan view of a first embodiment of the circuit of FIG. 3 using microstrip-line conductors.

A first embodiment of power amplifier 50 is shown as amplifier 74 in FIG. 5. Chip 75 has eight FETs, including FETs 76, 77, 78 and 79. Amplifier 74 includes similar series push-pull circuit sections 80 and 81. Quarter-wave input microstrip-line conductors 82 and 83 are connected by an air bridge 84. Similarly, input microstrip-line conductors 85 and 86 are connected by an air bridge 87. These conductors, which include quarter-wave portions such as portion 82a, provide input signals to each section. Electromagnetic coupling provides a complementary input signal to the second FET of the lower portion of each section, such as FETs 77 and 78. The respective second FETs are coupled together by respective U-shaped conductors 88 and 89. The microstrip lines on the output side are similar in general form to the conductors on the input side.

The microstrip lines are designed to achieve whatever impedance is needed. The input or output impedances are connected in series until the impedance is high enough, and then they are connected in a number of parallel sections appropriate for the desired power level.

Figure 8:
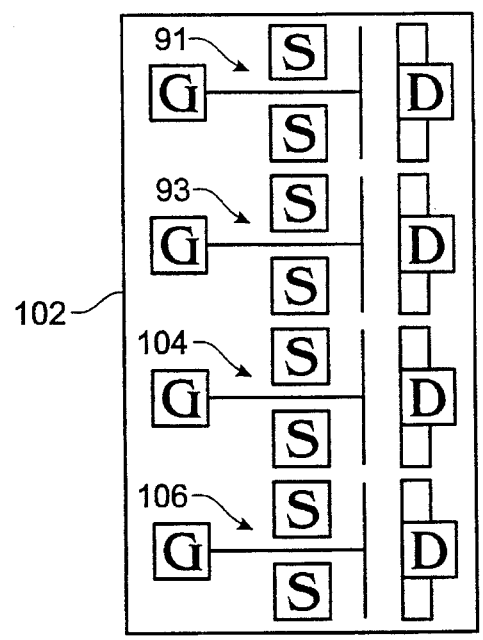
FIG. 8 illustrates a plan view of the layout of FETs in an array usable as a chip for the embodiment of FIG. 7.
Figure 6:
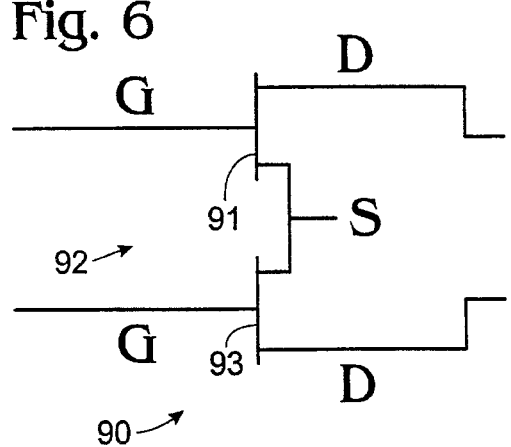
FIG. 6 illustrates a simple schematic of a push-pull amplifier usable in a second embodiment of the invention.
Figure 7:
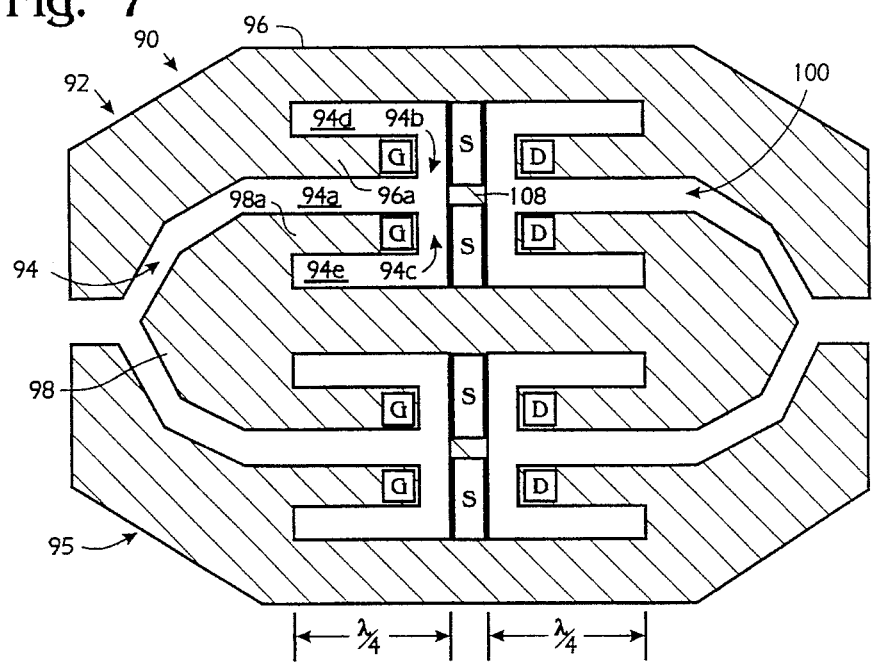
FIG. 7 illustrates a plan view of the second embodiment of the circuit of FIG. 3 using slotlines.

FIGS. 6–8 illustrate a power amplifier 90 that embodies the invention using slotlines. FIG. 6 is a schematic of a push-pull section 92 having two FETs 91 and 93 with joined sources. Two balanced input signals are applied to the respective gates, and two balanced output signals are produced on the respective drains.

FIG. 7 illustrates the preferred form of the slotlines for section 92 and an additional section 95 similar to section 92, as they would appear on the substrate of a motherboard, on a hybrid substrate, or on another type of base substrate. Amplifier 90 is operationally equivalent to amplifier 76. An input slotline 94, also referred to as a subcircuit of the circuit of amplifier 90 and formed by opposite planar conductors 96 and 98, is shaped like a reverse "E" with a long center leg portion 94a, oppositely extending transverse bends 94b and 94c, and closed-ended outer leg portions 94d and 94e that are parallel to center leg portion 94a. This shape produces respective open-ended conductor fingers 96a and 98a extending between the slotline leg portions.

The outer leg portions function as RF chokes. The output slotline 100 is a mirror image of the input slotline and functions the same way although the dimensions will be different due to impedance-matching differences of the input and output circuits. Corresponding FET structure is shown by chip 102 in FIG. 8 as it would appear when mounted on slotlines 94 and 100. Chip 102 contains FETs 91, 93, 104 and 106, having respective gate, source and drain terminals identified as G, S, and D. These terminals line up with the corresponding terminals identified in FIG. 7.

Chip 102 is flip mounted onto the metalization shown in FIG. 7, with the gate connected to the ends of the input fingers, the source is connected to a conductor 108 connecting conductors 96 and 98 between the backs of the E-shaped slotlines. Conductor 108 functions as a virtual ground. The drain terminals are accordingly connected to the ends of the output fingers, as shown.

FIGS. 9 and 10 illustrate yet a third power amplifier 110 embodying the invention. FIG. 9 illustrates a subcircuit 112 formed as metalization on the substrate of a motherboard, and FIG. 10 is an enlarged view of a flip-mounted chip 114 as it appears when mounted on the metalization. As is described in copending U.S. patent application Ser. No. 08/313,927 filed on Aug. 26, 1994 and assigned to the same assignee as the present invention, coplanar waveguides also provide impedance matching and signal transmission for power amplifiers.

Metalization 112 includes an input coplanar waveguide 116 having a signal conductor 118 and opposing planar ground or reference conductors 120 and 122. The signal conductor is initially a single line 118a, and then divides at a junction 124 into dual lines 118b and 118c. A resistor 126 connects lines 118b and 118c. A ground conductor 128 extends between the signal line.

Except for impedance-matching differences, an output coplanar waveguide 130 is substantially a mirror image of the input coplanar waveguide relative to a connecting ground plane strip 132 extending under FET-array chip 114. This metalization results in the array of FETs being connected in parallel rather than in series/parallel for push-pull operation, although the metalization for push-pull could also readily be constructed.

FIG. 10 is an illustration of FET chip 114 having two sets 134 and 135 of double FET-pairs 136. Each FET-pair 136 in the chip has an associated terminal flip-mounted to corresponding terminals on the subcircuit. Thus, a gate terminal 138 is connected to gates 139 and 140. Source terminals 141 and 142, and drain terminal 143, are connected respectively to sources 144 and 145, and drain 146. FET terminals 138, 141,142 and 143 are connected to respective subcircuit terminals 150, 151, 152 and 153.

Drain 146 functions as a dual drain for both FETs in each FET-pair 136. Similarly, each source like source 142 serves as a source for associated FETs in adjacent pairs. These double-duty terminals thus are, in effect, connected terminals.

Although chip 114 is specially designed in this embodiment, it could be modified to be cut from a wafer of sets of FET-pairs. In such a case, separate source terminals would be provided for each FET-pair 136 or set of double FET-pairs. Alternatively, amplifier 110 could be made with parallel, dual metalizations 112 and 130 to which is mounted a single chip having the FET configuration of chip 114 duplicated.

Figure 11:
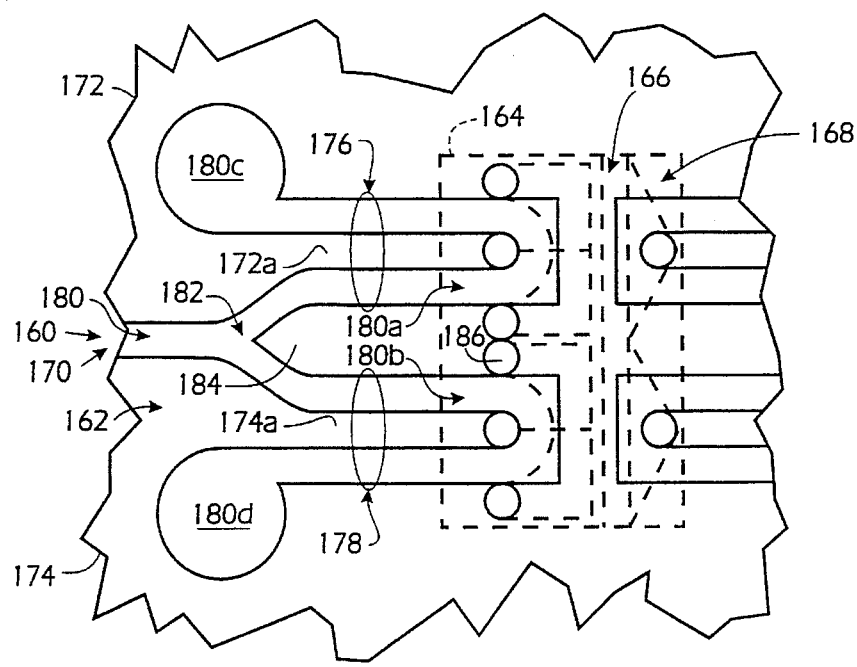
FIG. 11 is a plan view illustrating yet a fourth embodiment of the circuit of FIG. 3 having a conversion of slotline to dual coplanar waveguide.

Finally, FIG. 11 illustrates a portion of a power amplifier 160 having a motherboard subcircuit 162 to which is flip-mounted a FET chip 164, shown in dashed lines. As was the case with amplifier 110, the FETs, such as FET 166, in the array 168 of FETs in chip 164, are connected electrically in series at the input (gate).

The input portion of subcircuit 162 is different in this embodiment. It provides a conversion from an input slotline 170, formed by coplanar conductors 172 and 174, to dual coplanar waveguides 176 and 178. These output lines could be combined in a manner similar to the input circuit or as push-pull lines. Instead of terminating in the E-shaped slot of amplifier 90 illustrated in FIG. 7, a slot 180 divides at a junction 182 into elongate U-shaped slots 180a and 180b.

The U-shaped slots terminate in circular openings 180c and 180d. These openings function as open circuits, thereby allowing the input signal to be carried by respective conductors formed as open-ended conductor legs 172a and 174a extending into the U-shaped slots. An intermediate conductor 184, connected to conductors 172 and 174 beneath chip 164, extends from junction 182 to source terminals, such as terminal 186, of the FETs. The mounting and connection of the FETs to the conductors is the same as that described with regard to amplifier 90.

It will therefore be appreciated that the present invention provides a hybrid circuit structure in which a plurality of active devices are formed, preferably in an array, on a chip that is mounted on, and individually connected to a subcircuit formed on the substrate of a motherboard. This invention is particularly useful for multifunction chips and power amplifiers although it is applicable to any circuit or combination of circuits requiring contact with a plurality of individual active devices. The present invention is also particularly useful for push-pull configurations of FETs, for which various coplanar metalization patterns provide particular benefit. Connections may also exist between the active devices on a chip, and the subcircuits to which each active device is connected do not have to be related.

Other examples of circuits which would be advantageously embodied according to the invention include a power amplifier with an internal detector, a receiver with an RF low noise amplifier, a mixer, such as a Gilbert cell mixer, an oscillator with or without a tunable varactor, and an intermediate frequency amplifier. Arrays of diodes that perform special functions, such as are used in double-balanced or image-reject mixers, may also be built according to the invention. It is also applicable to phase shifters, particularly distributed line (artificial transmission line) and discrete diode/coupler types.

Preferably, in all these cases, the matrix die or chip only has active devices, such as FETs and diodes, that are flip-mounted to a substrate. Several advantages are thereby realized. The chip may be made using a single, simple FET (or diode) process, as well as a MMIC process. Prototyping is easily accommodated since the wafer can be cut up into a variety of different configurations. The production units can then be made the same as the prototype. Suitable wafers can be made even before the application is determined. High yields and high volume production are realizable.

It will therefore be apparent to one skilled in the art that variations in form and detail may be made in the preferred embodiments without varying from the spirit and scope of the invention as defined in the claims and any modification of the claim language or meaning as may be provided under the doctrine of equivalents. The preferred embodiments are thus provided for purposes of explanation and illustration, but not limitation.

I claim:

1. An electronic circuit structure comprising:
   a substrate;

a slotline mounted on the substrate and having a first planar slotline conductor and a second planar slotline conductor;

a first coplanar waveguide having first, second and third waveguide signal conductors, with the second and third waveguide conductors spaced from and positioned on opposite sides of the first waveguide conductor, with the space between the first waveguide conductor and the third waveguide conductor forming a first slot having a first slot width, with the first slotline conductor connected to both the first and third waveguide conductors, and with a first enlarged opening in the first slotline conductor in communication with the first slot and positioned where the first slotline conductor is connected to both the first and third waveguide conductors; and a chip having a transistor with a control terminal and two current-carrying terminals with the current flowing through the current-carrying terminals dependent upon the signal applied to the control terminal, the chip being mounted relative to the substrate with the control terminal flip-mounted on the first waveguide conductor and one current-carrying terminal flip-mounted on the second waveguide conductor; and output conductor means mounted on the substrate and connected to the other current-carrying terminal for conducting current through the transistor.

2. An electronic circuit structure comprising:

a substrate;

a first slotline mounted on the substrate and having a first planar slotline conductor and a second planar slotline conductor defining a first slot;

a first coplanar waveguide having first, second and third waveguide signal conductors, with the second and third waveguide conductors spaced from and positioned on opposite sides of the first waveguide conductor, with the space between the first waveguide conductor and the third waveguide conductor forming a first slot having a first slot width, with the first slotline conductor connected to both the first and third waveguide conductors, and with a first enlarged opening in the first slotline conductor in communication with the first slot and positioned where the first slotline conductor is connected to both the first and third waveguide conductors; and a second coplanar waveguide in parallel with the first coplanar waveguide, the second coplanar waveguide having a fourth waveguide conductor positioned adjacent to the second waveguide conductor and having a fifth waveguide conductor spaced from the fourth waveguide conductor opposite from the second waveguide conductor, with the space between the fourth waveguide conductor and the fifth waveguide conductor forming a second slot having a second slot width, with the second slotline conductor connected to both the fourth waveguide conductor and the fifth waveguide conductor, and with a second enlarged opening in the second slotline conductor in communication with the second slot positioned where the second slotline conductor is connected to both the fourth and fifth waveguide conductors.

* * * * *